United States Patent [19]
Cai et al.

[11] Patent Number: 5,841,664
[45] Date of Patent: Nov. 24, 1998

[54] METHOD FOR OPTIMIZING TRACK ASSIGNMENT IN A GRID-BASED CHANNEL ROUTER

[75] Inventors: Yang Cai, San Jose; Michael Chin-Hsen Lin, Fremont, both of Calif.

[73] Assignee: Avant! Corporation, Fremont, Calif.

[21] Appl. No.: 614,129

[22] Filed: Mar. 12, 1996

[51] Int. Cl.⁶ .............................. G06F 17/00; G06F 15/50
[52] U.S. Cl. .......................... 364/490; 364/488; 364/489; 364/491
[58] Field of Search ...................................... 364/488–491

[56] References Cited

U.S. PATENT DOCUMENTS

| 4,615,011 | 9/1986 | Linsker .................................. | 364/491 |
| 5,272,645 | 12/1993 | Kawakami et al. ..................... | 364/491 |
| 5,375,069 | 12/1994 | Sato et al. .............................. | 364/490 |

OTHER PUBLICATIONS

Tong Gao & L. Liu. "Minimum Crosstalk Channel Routing". Jul. 11, 1993. Urbana, Il.

Peter M. Maurer. "Automatic Routing of Integrated Circuit Connections: A Tutorial". Apr. 15, 1990. Tampa, Fl.

C.–L. Tse and W. Kinsner. "A graph–based heuristic channel router." Sep. 1988. Amsterdam, The Netherlands.

Howard H. Chen. "Breaking Cycles and Vertical Constraints in Deutsch's New and More Difficult Channel–Routing Problems." Aug. 14, 1989. Yorktown Heights, NY.

T.W. Her & D.F. Wong. "On Over–the–Cell Channel Routing with Cell Orientations Consideration." Jun. 1, 1995. NY.

P. Saratachandran "Dynamic Programming Approach for Multilayers Neural Network Optimization," IEEE, pp. 1397–1402, Jul. 1991.

*Primary Examiner*—Kevin J. Teska
*Assistant Examiner*—Vuthe Siek
*Attorney, Agent, or Firm*—Thomas E. Schatzel; Law Offices of Thomas E. Schatzel

[57] ABSTRACT

A method for optimal track assignment in a grid-based channel router. Initially, interconnection information is extracted from a global routing result. Multiple pin nets derived from the interconnection information are decomposed into simpler mapped segments. A channel grid map is then built and marked with existing objects. Next, a vertical constraint graph specifying the relative positions of the mapped segments is constructed. A first track is computed. A track assignment loop is repeated until all requisite connections are realized. The track assignment loop includes the steps of breaking cycles and long paths and collecting a set of feasible links. One or more weighting functions are assigned to each such feasible link. A dynamic programming approach is used to select an optimal set of feasible links according to the weighting functions. In addition, an optimal set of feasible links corresponding to unpreferred layers is collected by applying dynamic programming. Finally, the chosen feasible links are physically realized on the current track.

16 Claims, 6 Drawing Sheets

METHOD FOR OPTIMIZING TRACK ASSIGNMENT IN A GRID-BASED CHANNEL ROUTER

FIELD OF THE INVENTION

The present invention pertains to a method for optimizing the track assignment phase in a grid-based channel router.

BACKGROUND OF THE INVENTION

Advances in semiconductor technology have led the way towards more versatile, powerful, and faster integrated circuit (IC) chips in the fields of computer systems, telecommunications, instrumentation, etc. The trend is towards even larger, more complex and sophisticated IC chips in an effort to meet and improve upon the demands imposed by state-of-the-art performance. Today, a single IC chip can contain upwards of millions of transistors. As the complexity, functionalities, speed, and size of these chips increase, it is becoming a much more critical and difficult task to properly design, layout, and test the next generation of chips.

In order to meet these demands, a highly specialized field, commonly referred to as "electronic design automation" (EDA), has evolved, whereby computers are extensively used to automate the design, layout, and testing process. Indeed, it has now come to the point where the process has become so overwhelming that integrated circuits cannot be designed without the help of computer-aided design (CAD) systems. Computers are ideally suited to these tasks because they can be programmed to reduce or decompose large, complicated circuit designs into a multitude of much simpler functions. Whereupon, the computers can be programmed to iteratively solve these much simpler functions. In addition, CAD tools may then be employed to compact or otherwise minimize the die size required for a particular circuit. Minimizing the die size is important because as the die size shrinks, more dies (i.e., chips) can be fabricated from a given wafer. This directly translates into lower production costs.

Typically, the process begins with an engineer defining the input/output signals, desired functionalities, and performance characteristics of the new IC chip. This information is fed into a logic synthesis program which generates a specification defining the integrated circuit in terms of a particular semiconductor technology (e.g., very large scale integration—VLSI). This specification can be regarded as a template for the realization of the physical embodiment of the integrated circuit in terms of transistors, routing resources, etc. Next, a place and route CAD tool is used to determine the routing, pinouts, wiring, interconnections and general physical layout of the chip.

One common method used in the layout of a chip involves a grid-based channel approach. In this approach, the routing area (i.e., the channel) of the chip is divided into a number of different metal layers. Each of the metal layers is comprised of straight lines or "tracks" that run in one axis. For example, the metal1 and metal3 layers might have rows of tracks running horizontally, whereas the metal2 layer is comprised wholly of columns of tracks running vertically. Vias are used to connect the tracks of one metal layer to the tracks of another metal layer. Given this grid, one objective of the place and route process involves track assignment. The objective of track assignment is to assign a feasible set of wires and vias for each track to achieve the best result.

In the past, prior art grid-based channel routers have focused on using heuristic approaches to assigning tracks. However, these types of approaches tended to be inflexible. What works well under certain circumstances will not work optimally under different circumstances. There typically was no method for weighting different design criteria. Furthermore, the channel routers could not satisfy more than a single objective at any given time. In addition, these prior art approaches typically lacked any kind of control mechanism. As a result, there was no easy control over layer assignment of wires, wiring patterns and crosstalk noises; nor was there any mechanism to control the wiring pattern of certain spacial or critical nets (e.g., CLOCK or RESET). In addition, there was no mechanism for the intelligent selection or trade-off between run time and quality. As a result, die size and performance suffered.

Thus, there is a need for a grid-based channel router that produces optimal track assignment. It would be highly preferable if such a router could produce optimal results, given any weighting function without restriction on weighting criteria. The present invention offers such a grid-based channel router solution having the improved characteristics of optimality, versatility of weighting functions, flexibility of control, and selectivity of unpreferred layer wires.

SUMMARY OF THE INVENTION

The present invention pertains to a method for achieving optimal track assignment in a grid-based channel router. In a grid-based channel router, the routing area or channel is subdivided by horizontal and vertical straight lines to form grids. Each straight line is referred to as a track. The track assignment problem entails assigning a feasible set of wires and vias for each track to achieve the most optimal layout design of a VLSI circuit.

The initial step of the currently preferred embodiment of the present invention is to extract interconnection information from a global routing result. Multiple pin nets derived from the interconnection information are decomposed into simpler, mapped segments. A channel grid map is then built and marked with existing objects. Next, a vertical constraint graph specifying the relative positions of the mapped segments is constructed. Thereupon, a first track is computed. A track assignment loop is repeated until all requisite connections are realized. The track assignment loop includes the steps of breaking cycles and long paths and collecting a set of feasible links. One or more weighting functions are assigned to each feasible link. A dynamic programming approach is used to select an optimal set of feasible links according to the weighting functions. In addition, an optimal set of feasible links corresponding to unpreferred layers is collected by applying dynamic programming. Finally, the chosen feasible links are physically realized on the current track. If all connections have been made, the track assignment loop is finished. Otherwise, the vertical constraint graph is updated, the next routing track is determined, and the track assignment loop is repeated for this new routing track.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An optimal track assignment process in a grid-based channel router is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1A:
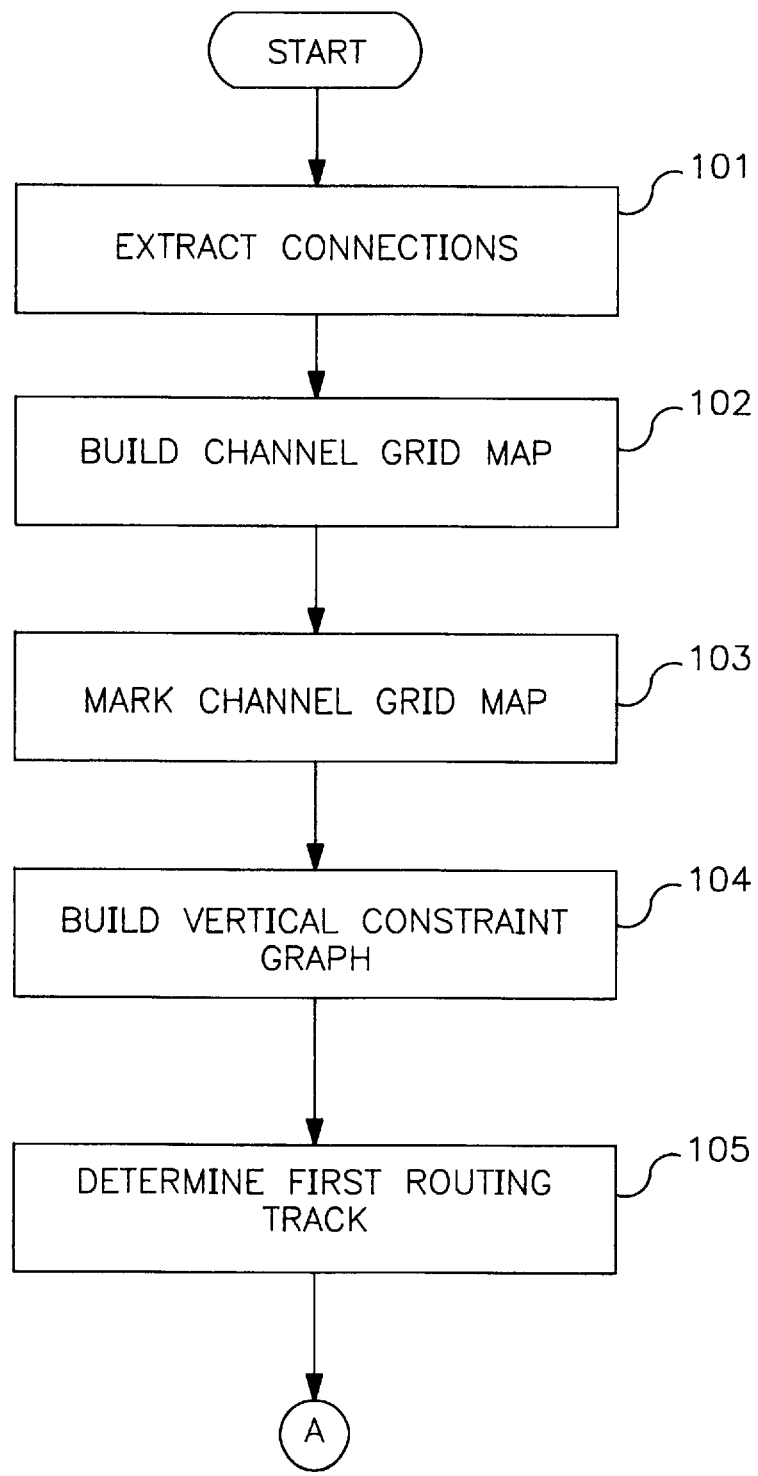
FIG. 1A is a flowchart describing the initial steps of the present invention for optimal track assignment in a grid-based channel router.
Figure 1B:
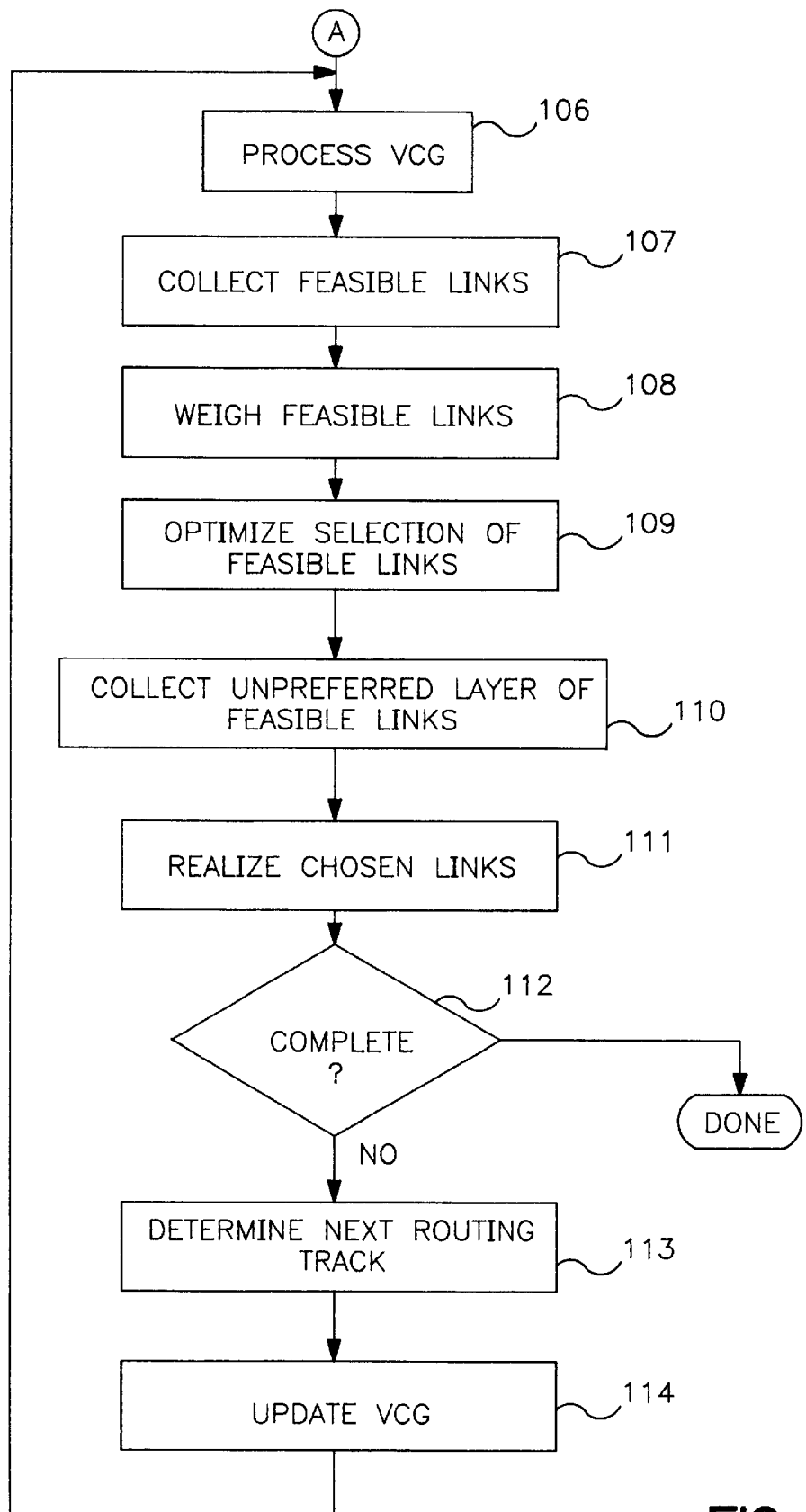
FIG. 1B is a flowchart describing the steps of the track assignment cycle according to the currently preferred embodiment of the present invention.
Figure 2:
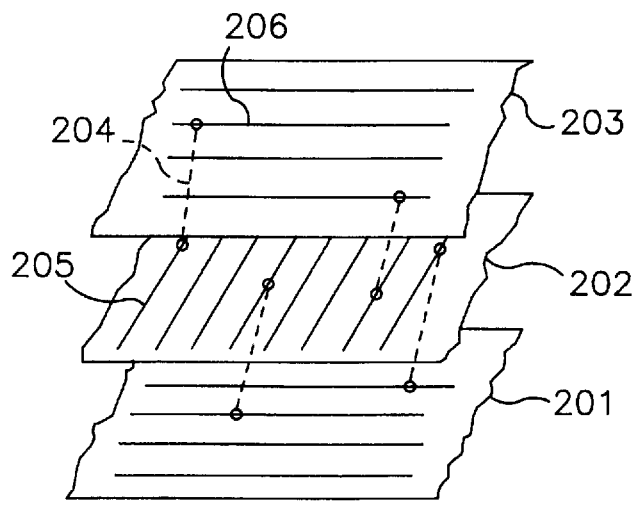
FIG. 2 shows a channel grid map that is comprised of three metal layers which are connected by a number of vias.

FIGS. 1A and 1B are flowcharts describing the overall steps of the track assignment process according to the present invention. Initially in step 101, the connections information is extracted from a netlist specification that was generated according to the integrated circuit design. A global routing result specifies pin locations and which of the pins are to be connected. Next, the channel grid map is built in step 102. In the currently preferred embodiment, the channel grid map is comprised of three metal layers which are connected by a number of vias, as shown in FIG. 2. The metal1 layer 201 and metal 3 layer 203 are comprised of horizontal tracks, whereas the metal 2 layer 202 is comprised of vertical tracks. These horizontal and vertical tracks define an overlapping grid upon the routing or channel area. Vias are used to connect the track of one metal layer to the track of another metal layer. For example, via 204 connects vertical track 205 of metal2 layer 202 to a horizontal track 206 of the metal3 layer 203. The pins are connected to the metal2 layer 202 and routed through the metal1 and metal2 layers to other points by means of the vias. It should be noted that the present invention may be applied to any number of metal layers as well as different types of grid configurations.

Figure 3:
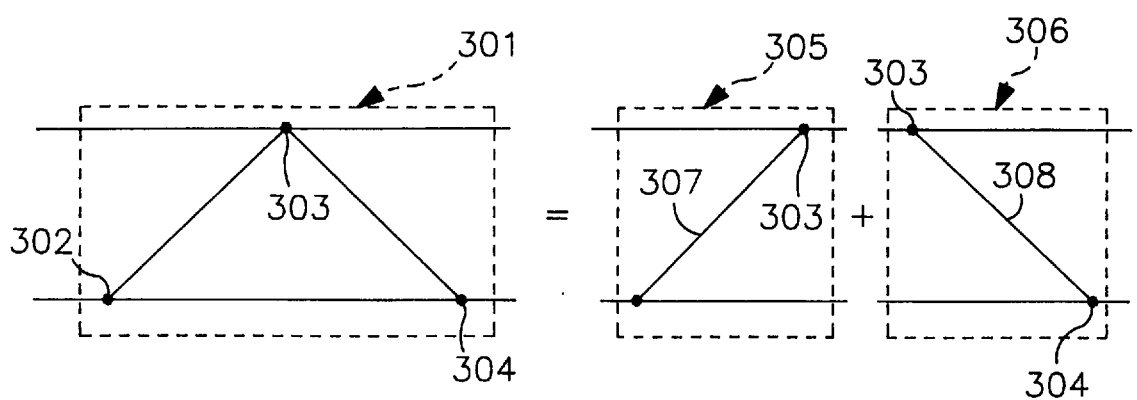
FIG. 3 shows an exemplary pin net as may be specified by the global routing result.

For purposes of track assignment, the pins are represented as points which are to be connected. Pin "nets" comprised of three or more interconnected pins, are decomposed into simpler combinations of two-pin subnets. These two-pin subnets are commonly known as "mapped segments." Referring to FIG. 3, a particular pin net 301 might be specified by the global routing result. In this example, pin net 301 is comprised of three interconnected points 302–304. This pin net 301 can be decomposed into two mapped segments, shown as 305 and 306. Mapped segment 305 is comprised of a point-to-point connection 307 established between points 302 and 303. And mapped segment 306 is comprised of a separate point-to-point connection 308 that is established between points 303 and 304. Future processing is then performed on a mapped segment basis.

Figure 4:
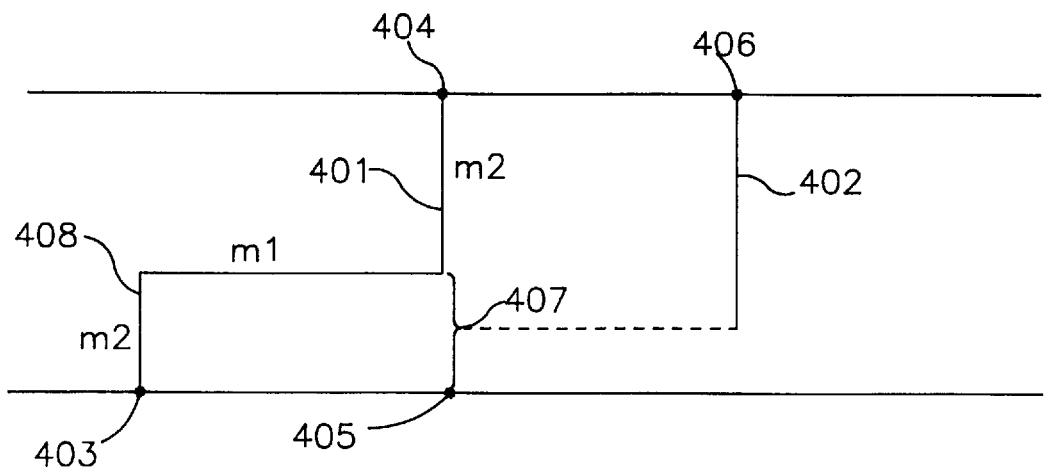
FIG. 4 illustrates an example of information conveyed in a sample VCG.

Referring back to the flowchart of FIG. 2A, once the channel grid map has been built, existing objects (e.g., wires, vias, etc.) are marked on the channel grid map, step 103. Next, a vertical constraint graph (VCG) is built according to the mapped segments. The VCG is used to maintain the relative positions of these segments inside the channel. An example of the information conveyed in a VCG is shown in FIG. 4. Two mapped segments 401 and 402 are shown. Mapped segment 401 is comprised of an interconnection between nodes 403 and 404, and mapped segment 402 is comprised of an interconnection between nodes 405 and 406. In this example, the interconnection for mapped segment 401 is comprised of metal2 (m2), metal1 (m1), and metal2 (m2) lines. Likewise, the second mapped segment 402 is comprised of m2, m1, and m2 lines. However, it can be seen that the vertical m2 connection 407 corresponding to mapped segment 402 cannot extend beyond the vertical m2 connection 408 of mapped segment 401. Otherwise, a short circuit would develop. The vertical m2 line of mapped segment 402 can extend throughout the range of 407, but cannot extend beyond the height of 407. A VCG is developed to contain the vertical ordering of the lines for each mapped segment in order to prevent short circuits from occurring.

After the VCG has been generated, the first track (i.e., a straight line of the grid along the channel direction) is computed, as shown in step 105 of FIG. 1A. In the currently preferred embodiment, tracks are assigned on an outside-in approach, whereby the first track is the best track that is selected from either the top-most or bottom-most position. Next, a track assignment cycle is repeated until all the requisite track assignments are made. The steps of this track assignment loop are shown in FIG. 1B as steps 106–114. Basically, the VCG is processed, step 106. All feasible links are then collected, step 107. The feasible links are weighted according to one or more objectives, step 108. Next, an optimal set of feasible links is selected according to the results of the weighting functions, step 109. The feasible links corresponding to the unpreferred layers are collected, and the chosen links are finally realized, steps 110–111. Step 112 determines whether all connections have been completed. If so, the loop is done. Otherwise, the VCG is updated, and the loop is repeated for the next routing track, steps 113 and 114.

Figure 5:
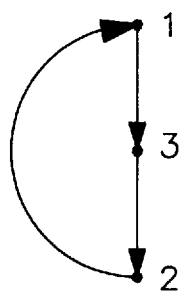
FIG. 5 shows a cycle consisting of three nodes.
Figure 5:
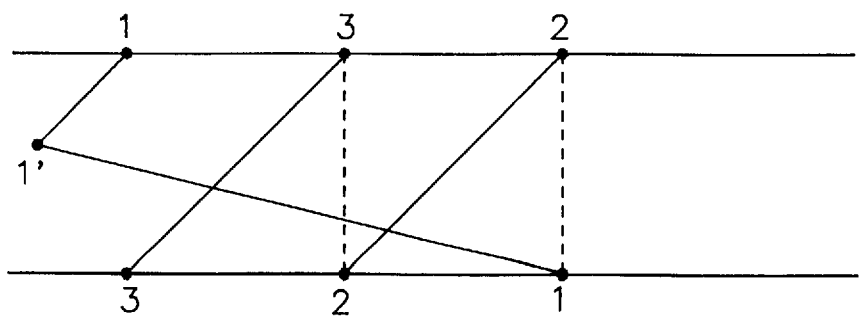

A more detailed description of the track assignment loop is now offered. The first step 106 of this loop is to process the VCG so that cycles and long paths are broken. FIG. 5 shows a cycle consisting of three nodes 501–503. Node 1 is above node 3; node 3 is above node 2; and node 2 is above node 1. It can be seen that by following the sequence of connections, one returns back to the original starting point. In order to complete the routing, this cycle must first be broken. One example of how this cycle can be broken is depicted by implementing a node 1'. Node 1' breaks the path from node 3 to node 1. Consequently, node 1 is no longer above node 3. Likewise, longpaths must be broken. Longpaths consist of a sequence of lines, all in the same direction. Each node on the longpath is on a different row because one node is above the previous node. Hence, numerous rows are consumed, unless the longpath is broken.

Figure 6:
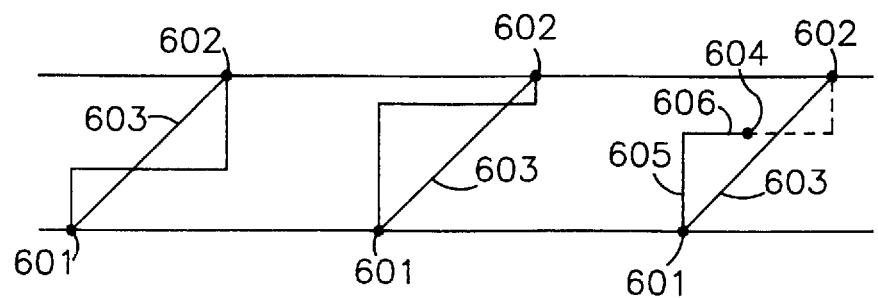
FIG. 6 shows three possible sets of feasible links for implementing a segment that connects two points.

The final goal of the channel routing problem is to complete all of the requisite routing within a minimal area (i.e., to minimize the die size). This is accomplished in the present invention on a row-by-row basis. Links are collected for each of the mapped segments. A link is either a vertical or horizontal connection. These links are used to render the point-to-point segments that were established earlier. Referring back to FIG. 1B, step 107 calls for collecting all feasible links. A feasible link is defined as a complete or partial legal realization of mapped segments on the current track. There may exist many different feasible links for accomplishing a segment. For example, FIG. 6 shows three possible sets of feasible links for implementing a segment 603 that connects point 601 to point 602. In the right-most set, feasible links 605 and 606 connect point 601 to point 604, thereby forming a partial segment. Eventually, other feasible links must be implemented to connect point 604 to point 602.

The feasible links are then weighted according to one or more metrics (see step 108 of FIG. 1B). A weight is a measurement of a pre-determined merit of the feasible links. A user assigns a "weight" to indicate the degree of importance that is placed on various attributes of the design. In other words, to each feasible link, a weight is assigned to measure the merit of having that particular feasible link being realized on the current track. In the present invention, there are no restrictions on how the feasible links are to be weighted. Weighting functions can be used to minimize congestion or channel density. For instance, a set of feasible links that achieves minimal congestion will result in a greater value than one which results in a great deal of congestion. Based on this information, the feasible links associated with less congestion is preferred over the set of feasible links having greater congestion. Weighting functions can also be used to reduce the wire length and via number. This can be used to improve performance. Likewise, they can be used to optimize vertical constraints (e.g., preference is weighted towards favoring longer Y lengths to yield better channel utilization). Furthermore, weighting functions can be used to exclude or discourage the selection of unfavorable feasible links. It should be noted that the present invention allows any combination of different objectives to be specified by the user.

With the concept of feasible links and the choice of weighting functions, there are provided two levels of flexible control mechanism over the behavior of the channel router. First, this provides a ready control mechanism over the layer assignment for wires, wiring patters and crosstalk noise problems. Also, by limiting the number of feasible links, one can arrive at the best trade-off between run time and quality. In addition, this mechanism can be used to control the wiring pattern of certain special or critical nets (e.g., CLOCK, RESET, etc.). This is becoming increasingly important as one advances into the deep submicron level, where the result of the channel router has to be carefully manipulated in order to satisfy stringent performance requirements.

Based on the summed weighting functions, an optimal set of feasible links that can be legally realized as a whole on the current track, is then selected (see step 109 of FIG. 1B). This set of feasible links is optimally selected by applying a dynamic programming approach. The dynamic programming approach entails reducing a large instance of a problem into several smaller instances of the problem; solving for the smaller instances and expanding the solutions back to solve for the original, larger instance. A detailed description of dynamic programming can be found in the text book by Alto, Hopcroft, and Ullman, *The Design and Analysis of Computer Algorithms*, Addison-Wesley (1974). As an example, the dynamic programming approach can be used to solve for N columns by recursively solving for N-1, N-2, N-3, etc. columns.

In order to further minimize the channel width, the currently preferred embodiment of the present invention has the ability to optimally select wires in preferred layers as well as unpreferred layers. This step corresponds to block 110 of the flowchart of FIG. 1B. As described above, each metal layer has a preferred direction. For instance, the preferred direction for the metal2 layer is vertical; and the preferred direction for the metal1 and metal3 layers is horizontal. A wire running through the grid line of a channel can exist either on the preferred layer or on an unpreferred layer that runs in a different direction. In other words, unpreferred layer wires are used in channel routing to share tracks with preferred layer wires to reduce the channel width.

Figure 7:
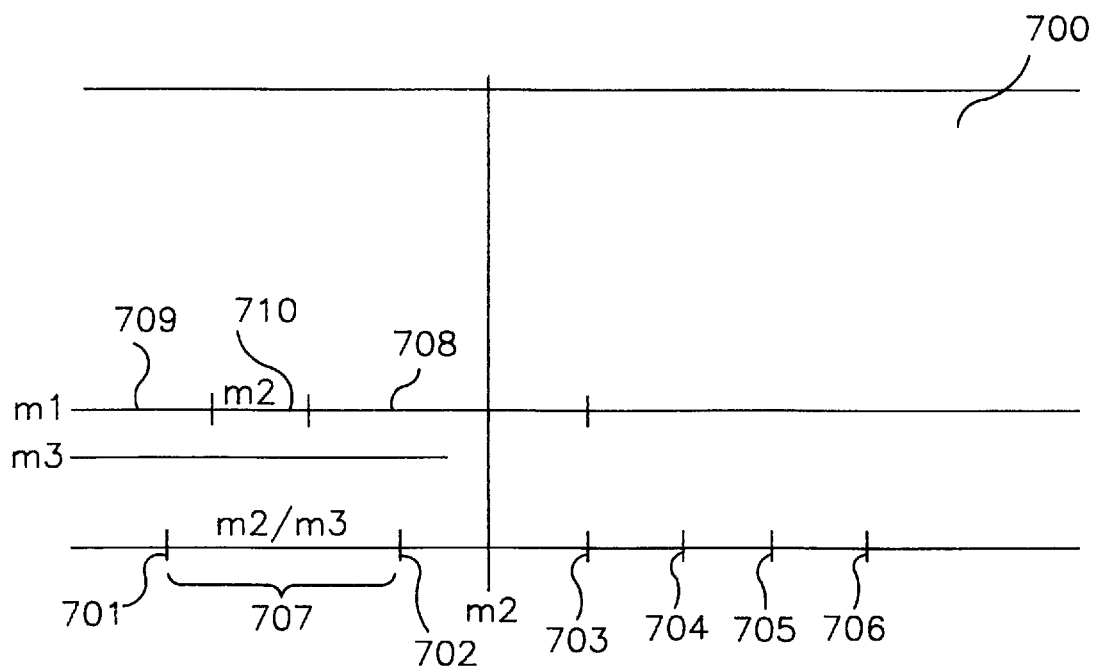
FIG. 7 shows a channel having a wire running through a grid line on a preferred metal1 layer and an unpreferred metal2 layer.

FIG. 7 shows a channel 700 having a wire running through a grid line on a preferred metal1 layer and an unpreferred metal2 layer. Normally, most of the pins 701–706 are connected to the metal2 layer. Consequently, the metal2 layer is usually reserved for these pin connections. Other connections are made through the metal1 and metal3 layers. However, under certain circumstances, a track may run through two different layers—a preferred layer and an unpreferred layer. For example, there are no pins in area 707. Hence, track 708 can contain a metal1 wire 709 and a metal2 wire 710. In this example, the metal2 wire is in the unpreferred layer. Furthermore, since the metal2 layer can operate with the metal1 layer, the metal2 wire does not occupy any additional space of the channel. This serves to minimize the die size. In the track assignment process, unpreferred layer wires are chosen in the dynamic programming approach along with the preferred layer wires. Unpreferred layer wires are also selected in a second phase where, for each chosen preferred layer wire, an optimal legal set of unpreferred layer wires covered by it is chosen, again by using a dynamic programming approach. Utilizing as many unpreferred layer wires as possible will help reduce the channel width.

The chosen set of optimal links are finally physically realized on the current track (see step 111 of FIG. 1B). This is accomplished by converting the feasible links into physical wires and vias with nonzero dimensions. A determination is then made as to whether all connections have been made, step 111. If so, then the loop ends. Otherwise, the next routing track is determined, step 113. The vertical constraint graph is updated, step 114. The track assignment loop of steps 106–112 is repeated for the next track.

Figure 8:
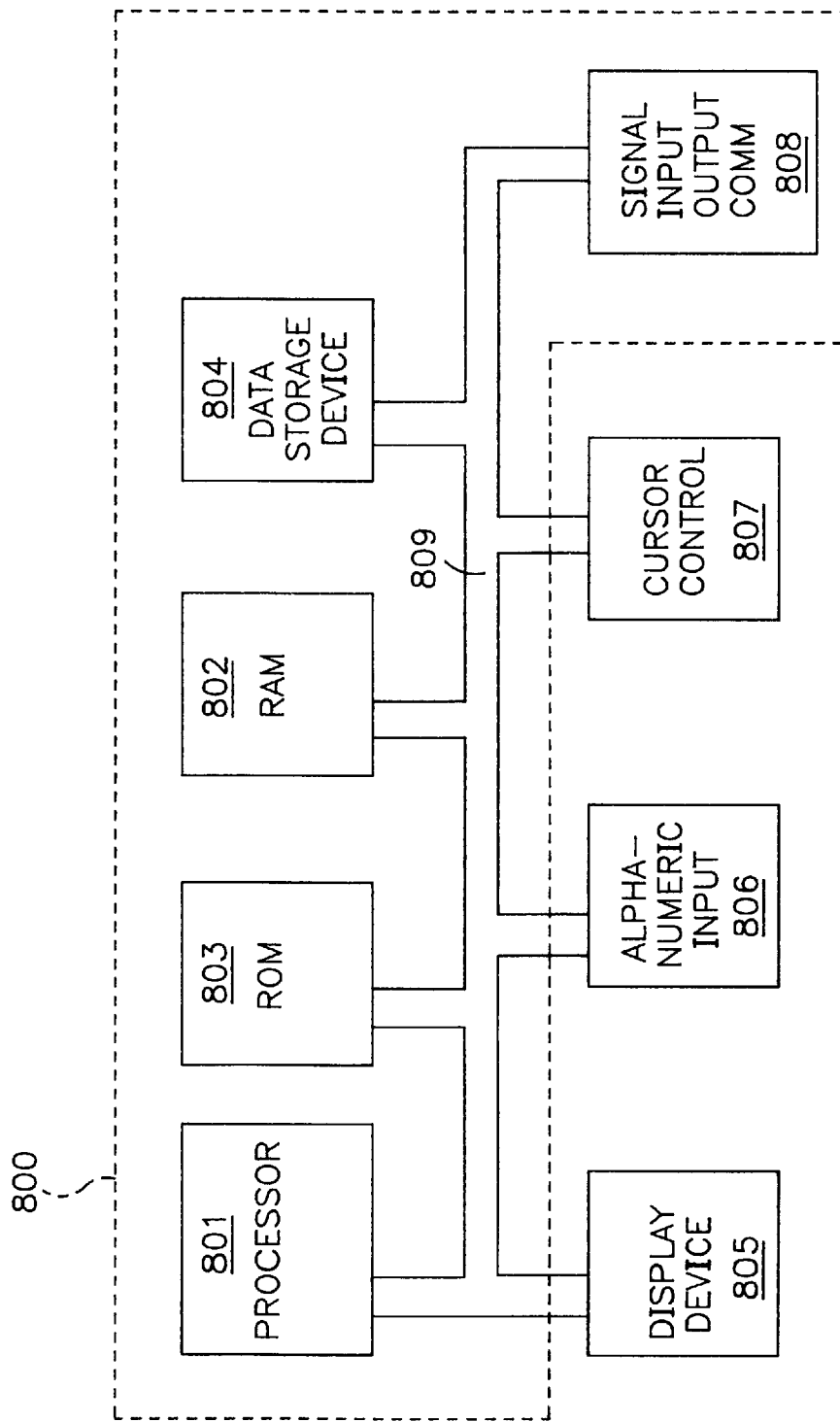
FIG. 8 illustrates an exemplary computer system upon which the present invention may be implemented or practiced.

FIG. 8 illustrates an exemplary computer system 800 upon which the present invention may be implemented or practiced. It is appreciated that the computer system 800 of FIG. 8 is exemplary only and that the present invention can operate within a number of different computer systems including general purpose computers systems, embedded computer systems, and computer systems specially adapted for electronic design automation.

Computer system 800 of FIG. 8 includes an address/data bus 809 for conveying digital information between the various components, a central processor unit (CPU) 801 for processing the digital information and instructions, a random access memory (RAM) 802 for storing the digital information and instructions, a read only memory (ROM) 803 for storing information and instructions of a more permanent nature. In addition, computer system 800 may also include a data storage device 104 (e.g., a magnetic, optical, floppy, or tape drive) for storing vast amounts of data, and an I/O interface 808 for interfacing with peripheral devices (e.g., computer network, modem, etc.). It should be noted that the present invention may be embodied Devices which may be coupled to computer system 800 include a display device 805 for displaying information (e.g., channel grid map, vertical constraint graphs, weighting functions, feasible links, etc.) to a computer user, an alphanumeric input device 806 (e.g., a keyboard), and a cursor control device 807 (e.g., mouse, trackball, light pen, etc.) for inputting data and selections.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A grid-based method for routing wire connections through a routing channel area between nodes by an automated computer design system, the method comprising the steps of:

extracting from an externally supplied netlist specification a set of wire connection information that relates to a particular semiconductor integrated circuit design, wherein nodes that are described to be interconnected in pin-nets are decomposed into a plurality of mapped segments each comprising two-pin subnets, and wherein said mapped segments are each directly vectored between a pair of pins in a two-pin subnet;

building a channel grid map comprised of a plurality of metal layers interconnectable by a plurality of vias, wherein each metal layer defines a system of horizontal tracks or vertical tracks with one system of horizontal tracks or vertical tracks being preferred over another in particular metal layers, and such systems of horizontal tracks and vertical tracks in all said metal layers together defining an orthogonally overlapping grid within a channel routing area, and wherein individual said vias are used to connect a track of one metal layer to a criss-crossing track of another metal layer;

earmarking any existing wires and vias on said channel grid map;

building a vertical constraint graph (VCG) that identifies which portions of each vertical track in each of a corresponding said plurality of metal layers have already been earmarked for use by previously routed mapped segments, wherein a mapped segment currently being routed is constrained from using any already-earmarked portions of said vertical tracks in said plurality of metal layers;

computing a plurality of track assignments by first breaking cycles and longpaths between said nodes to reduce the number of interconnections with said channel routing area to complete a particular pin net according to said netlist specification, then by assigning a feasible set of wires and vias for each track to achieve a particular result;

controlling a layer assignment process through the use of a selected set of weighting functions chosen for each said metal layer to balance a plurality of objectives in a final design, and that provides a mechanism for an intelligent trade-off between computer run time and design-result quality;

completing all of a requisite routing within a minimal channel routing area on a row-by-row basis wherein a zigzag chain of individual feasible horizontal and vertical wire segment links with ideal zero line widths are assembled according to said layer assignment process and that attempt to approximate a direct vector of each said mapped segment; and physically realizing each of said zigzag chains of individual feasible horizontal and vertical wire segment links with ideal zero line widths by assigning a finite line width to each.

2. The method of claim 1, wherein:
   the weighting function is used to minimize congestion.

3. The method of claim 1, wherein:
   the weighting function is used to minimize channel density, wherein the channel is comprised of a routing area of the layout.

4. The method of claim 1, wherein:
   the weighting function is used to minimize wire lengths.

5. The method of claim 1, wherein:
   the weighting function is used to minimize a number of vias.

6. The method of claim 1, wherein:
   the weighting function is used to optimize vertical constraints.

7. The method of claim 1, further comprising the steps of:
   assigning a combination of a plurality of weighting functions;
   selecting optimal feasible links according to the combination of weighting functions.

8. The method of claim 1 further comprising the step of:
   limiting a number of feasible links to characterize run time and quality of the layout.

9. The method of claim 1, further comprising the steps of:
   selecting and implementing a set of unpreferred layer wires by using a dynamic programming approach.

10. In a computer implemented channel router for designing a circuit, a method of assigning a set of wires and vias for a plurality of tracks of a channel routing area, comprising the steps of:

a) breaking cycles and long paths associated with mapped segments which define interconnections of the circuit;
    b) determining a plurality of feasible links corresponding to the mapped segments for a current track;
    c) applying one or more weighting functions to the feasible links, wherein the weighting functions measure a merit of realizing a particular feasible link onto the current track;
    d) selecting an optimal set of feasible links according to the weighting functions;
    e) realizing the optimal set of feasible links;
    f) repeating steps a–e until each connection of the circuit has been routed; and
    g) determining a set of preferred layer wires and a set of unpreferred layer wires by using dynamic programming, wherein an unpreferred layer wire shares a same track as a preferred layer wire;
    wherein, the weighting functions include a combination of criteria for minimizing channel density, minimizing wire length, minimizing a number of vias, optimizing vertical constraints, and discouraging selection of unfavorable feasible links.

11. The method of claim 10 further comprising the steps of:

extracting interconnection information from a global routing result;
    building a channel grid map according to mapped segments derived from the interconnection information;

marking the channel grid map with vias and wires;

maintaining relative positions of the mapped segments inside the channel routing area; and determining a first routing track.

12. The method of claim 11, wherein:

the channel grid map is comprised of a plurality of layers having horizontal and vertical straight lines.

13. The method of claim 10 further comprising the step of:

limiting a number of feasible links to control run time.

14. The method of claim 10 further comprising the step of:

controlling a wiring pattern corresponding to critical nets based on the feasible links and choice of weighting functions applied to the feasible links.

15. A computer-readable memory encoded with data representing a computer program that causes a computer to perform a method for assigning tracks in a grid-based channel router used to design circuits, wherein the method is comprised of the steps of:

decomposing a pin net into a plurality of mapped segments;

constructing a channel grid map comprised of horizontal and vertical lines coupled by a plurality of vias;

maintaining relative positions of the mapped segments;

determining a set of feasible links representing connections corresponding to the mapped segments;

assigning a weight to the feasible links;

selecting the feasible links as a function of the weight by using a dynamic programming approach;

converting the feasible links into representations of physical wires and vias with non-zero dimensions; and determining a set of preferred layer wires and a set of unpreferred layer wires by using dynamic programming, wherein an unpreferred layer wire share a track with a preferred layer wire;

wherein, the weight is comprised of a combination of criteria including minimizing channel density, minimizing wire length, minimizing a number of vias, optimizing vertical constraints, and discouraging selection of unfavorable feasible links.

16. The method of claim 15 further comprising the step of:

controlling a wiring pattern corresponding to critical nets based on the feasible links and choice of weights applied to the feasible links.

\* \* \* \* \*